US008058713B2

(12) United States Patent
Nakayama

(10) Patent No.: US 8,058,713 B2
(45) Date of Patent: Nov. 15, 2011

(54) COF PACKAGE AND TAPE SUBSTRATE USED IN SAME

(75) Inventor: Akira Nakayama, Ibaraki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 77 days.

(21) Appl. No.: 12/052,172

(22) Filed: Mar. 20, 2008

(65) Prior Publication Data

US 2009/0079047 A1 Mar. 26, 2009

(30) Foreign Application Priority Data

Sep. 25, 2007 (JP) ................................. 2007-247503

(51) Int. Cl.
*H01L 23/495* (2006.01)
(52) U.S. Cl. ................ 257/668; 257/692; 257/E23.055; 438/123
(58) Field of Classification Search ................... 257/668
See application file for complete search history.

(56) References Cited

U.S. PATENT DOCUMENTS

| 6,867,490 B2 * | 3/2005 | Toyosawa ..................... 257/692 |
| 7,379,307 B2 | 5/2008 | Imamura et al. |
| 2002/0109814 A1 | 8/2002 | Murahashi et al. |
| 2004/0070057 A1 | 4/2004 | Yoshiike et al. |
| 2008/0043195 A1 * | 2/2008 | Shiki ............................ 349/150 |

FOREIGN PATENT DOCUMENTS

| JP | 9260579 A | 10/1997 |
| JP | 2002124537 A | 4/2002 |
| JP | 2002244580 A | 8/2002 |
| JP | 2004127974 A | 4/2004 |
| JP | 200680167 A | 3/2006 |
| JP | 2006080167 | 3/2006 |
| JP | 200781058 A | 3/2007 |

* cited by examiner

*Primary Examiner* — Ajay K Arora
(74) *Attorney, Agent, or Firm* — Volentine & Whitt, PLLC

(57) ABSTRACT

A COF package having a tape substrate including external input terminals and external output terminals provided in a chip non-mounting area, input wirings connected to the external input terminals respectively, output wirings connected to the external output terminals respectively, internal input wirings which are provided from the chip non-mounting area to a chip mounting area and provided between the input wirings and which are connected to the external input terminals, respectively, and a dummy wiring provided from the chip non-mounting area to the chip mounting area and provided between the internal input wirings; and a semiconductor chip including input electrodes connected to the input wirings respectively, output electrodes connected to the output wirings respectively, internal input electrodes connected to the internal input wirings respectively, and a dummy electrode provided spaced from each input electrode along one side of the chip surface, and connected to the dummy wiring.

12 Claims, 3 Drawing Sheets

COF PACKAGE AND TAPE SUBSTRATE USED IN SAME

BACKGROUND OF THE INVENTION

The present invention relates to a COP package and a tape substrate used therein.

A driver mounted in a liquid crystal display is generally mounted in its corresponding display in a state in which a semiconductor element is being sealed onto a substrate made up of a tape. In a recent driver for a display or display unit, the proportion of a D/A converter for converting a digital signal to an analog signal within a semiconductor element is so increasing with multigradation. With the scale-up of the display unit and a reduction in the number of drivers mounted to the display unit, the number of output terminals per driver is exceeding 720. Respective companies or manufacturers involve a problem that since the recent driver needs to form so many wiring areas inside the semiconductor element in order to meet these demands, the area of the semiconductor element increases significantly.

Since a chip area is headed for its reduction contrary to the increase in the number of the output terminals, the interval between adjacent electrodes provided on a chip is becoming very narrow. With its view, there has been an increasingly demand for a COF (Chip On Film) which can be miniaturized than a TCP (Tape Carrier Package).

Disclosed in a patent document 1 (Japanese Unexamined Patent Publication No. 2006-80167) is a technique wherein with a view toward realizing a size and weight reduction in semiconductor device by paying attention to an increase in wiring in a semiconductor element, particularly, a problem that wirings must be routed or run from an electric circuit of the semiconductor element to bumps when signals are taken out from the electric circuit to the outside, semiconductor element surface bumps provided at the center of the semiconductor element corresponding to the output of the electric circuit, and bumps provided at the outer peripheral portion of the semiconductor element are respectively connected by wiring patterns provided on a substrate.

According to the present technique, since the connections between the semiconductor element circuit and the wiring patterns can be conducted even by connecting wirings, the connecting wirings can be substituted for the wirings routed at the surface or inside, thus resulting in the realization of a size and weight reduction in the semiconductor element.

In the technique disclosed in the patent document 1, however, no consideration was given to the signals inputted to the semiconductor element although the wirings relative to the output of the semiconductor element circuit can be reduced. Under the stereotype that first connecting terminals are formed at a peripheral portion on the semiconductor element in particular, the size reduction in the semiconductor element was insufficient. It also falls short of examining a structure that makes it possible to ensure reliability with a size reduction in chip.

SUMMARY OF THE INVENTION

The present invention has been made in view of the foregoing points. The present invention aims to provide a COF package which realizes a reduction in chip and high reliability, and a tape substrate employed therein.

According to one aspect of the present invention, for attaining the above object, there is provided a COF package comprising:

a tape substrate including a rectangular chip mounting area and a chip non-mounting area and comprising a plurality of external input terminals and a plurality of external output terminals provided in the chip non-mounting area, a plurality of input wirings provided from the chip non-mounting area to the chip mounting area and connected to the external input terminals respectively, a plurality of output wirings provided from the chip non-mounting area to the chip mounting area and connected to the external output terminals respectively, a plurality of internal input wirings which are provided from the chip non-mounting area to the chip mounting area and provided between the input wirings and which are connected to the external input terminals, respectively, and a dummy wiring provided from the chip non-mounting area to the chip mounting area and provided between the internal input wirings, and a semiconductor chip comprising a plurality of input electrodes provided along one side extending over a chip surface and connected to the input wirings respectively, a plurality of output electrodes provided along a periphery extending over the chip surface and connected to the input wirings respectively, internal input electrodes provided over the chip surface and inside the input and output electrodes and connected to the internal input wirings respectively, and a dummy electrode provided with being spaced from each of the input electrodes along the one side lying over the chip surface and, and connected to the dummy wiring.

According to another aspect of the present invention, for attaining the above object, there is provided a tape substrate which has a rectangular chip mounting area including thereinside output electrode connecting areas provided therearound, input electrode connecting areas provided along one side thereof, a plurality of wiring passage areas provided between the input electrode connecting areas and along the one side, dummy electrode connecting areas provided between the wiring passage areas and provided along the one side, an internal electrode connecting area provided inside the input electrode connecting areas and the output electrode connecting areas, wherein the input wirings include first wiring patterns provided from the external input terminals to the input electrode connecting areas, and third wiring patterns provided from the external input terminals to the internal electrode connecting area and provided through the wiring passage areas, and wherein the input wirings include fourth wiring patterns provided between the third wiring patterns and in the dummy electrode connecting areas.

A COF package of the present invention and a tape substrate employed therein can contribute to a size reduction in a semiconductor chip and hold high reliability by taking the constitution of the invention.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
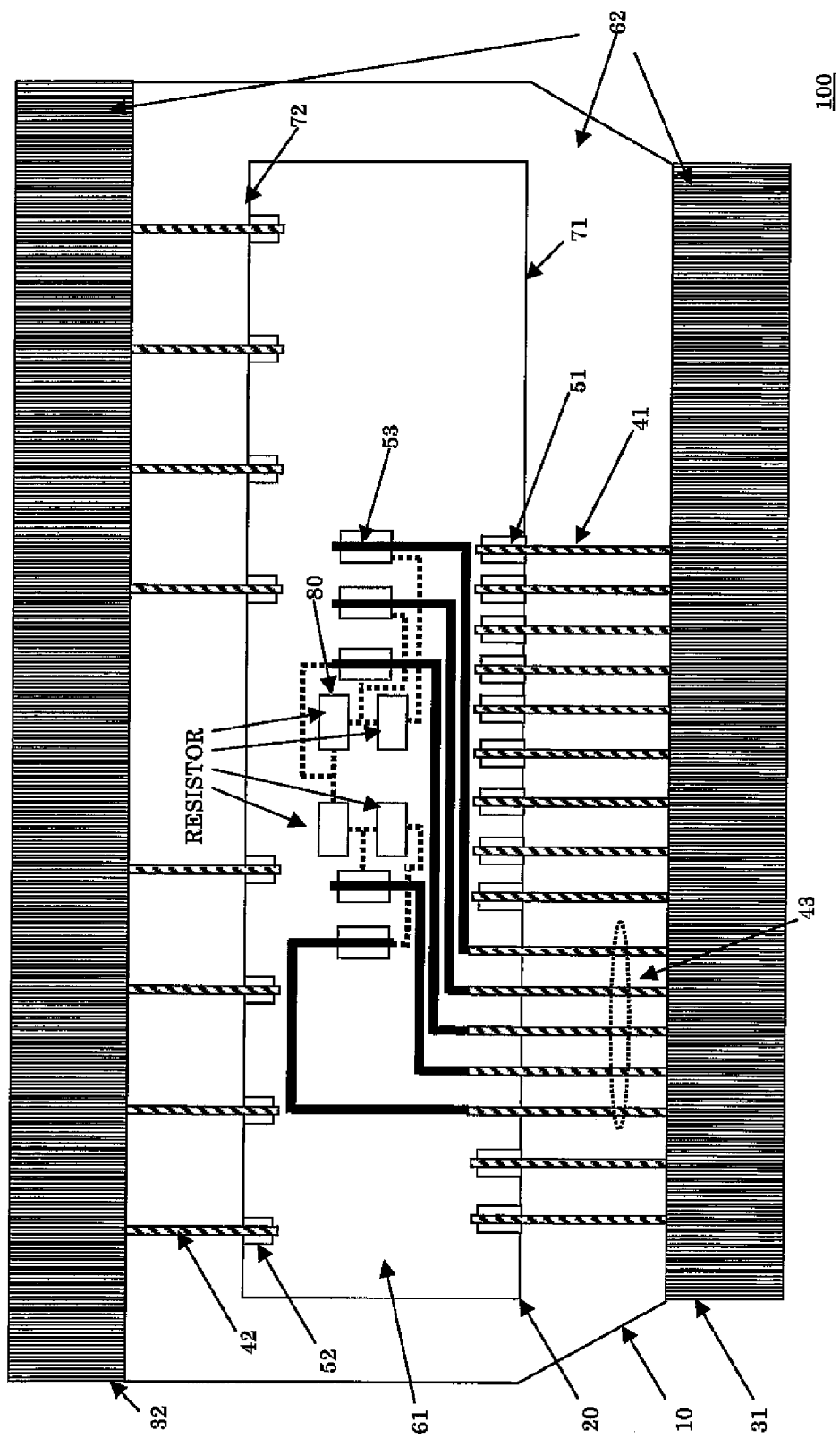
FIG. 1 is a conceptual diagram showing a COF package according to a first embodiment of the present invention.

Preferred embodiments of the present invention will hereinafter be described in detail with reference to the accompanying drawings. Incidentally, the same reference numerals are respectively attached to constituent elements having approximately identical functions and configurations in the following description and accompanying drawings.

First Preferred Embodiment

FIG. 1 is a conceptual diagram showing a COF package 100 according to a first embodiment of the present invention. The configuration of the present embodiment will be explained using FIG. 1. In the COF package 100, a rectangular semiconductor chip 20 is mounted on a tape substrate 10 in such a manner that a circuit forming surface of the semiconductor chip 20 is opposite to the tape substrate 10. The semiconductor chip 20 is generally sealed with an unillustrated sealing or encapsulating resin.

The tape substrate 10 includes, as minimum constituent requirements, external input terminals 31, external output terminals 32, input wirings 41 each corresponding to a first wiring pattern, output wirings 42 each corresponding to a second wiring pattern, and internal input wirings 43 each corresponding to a third wiring pattern. The semiconductor chip 20 is equipped with, as minimum constituent requirements, input electrodes 51 each corresponding to a first electrode, output electrodes 52 each corresponding to a second electrode, and internal input electrodes 53 each corresponding to a third electrode.

The tape substrate 10 is divided broadly into a chip mounting area 61 corresponding to an area equipped with the semiconductor chip 10 and a chip non-mounting area 62 corresponding to other area. The chip mounting area 61 is represented in rectangular form. The chip non-mounting area 62 is provided with the external input terminals 31 and the external output terminals 32. In general, the external input terminals 31 are connected to the output of an IC for controlling the COF package and inputted with various signals. Particularly when the semiconductor chip of the present invention is of a driver IC for a liquid crystal display, signals sent from a power supply IC, a timing controller IC (T-CON) and the like are inputted to the external input terminals. The external output terminals 32 are used to output signals processed by the semiconductor chip 20 of the present invention. Particularly when the semiconductor chip of the present invention corresponds to the driver IC for the liquid crystal display, the external output terminals 32 are connected to a panel of the liquid crystal display and used to output analog voltages or the like to be written into its liquid crystal.

The input wirings 41, output wirings 42 and internal input wirings 43 are provided from the chip non-mounting area 62 to the chip mounting area 61. The input wirings 41 have one ends respectively connected to the external input terminals 31 and the other ends respectively disposed at positions extending along a first side 71 of the chip mounting area 61. In other words, the other ends are disposed at the peripheral edge of the chip mounting area. The input wirings 41 are provided in plural form and formed integrally with the external input terminals 31 as needed. The output wirings 42 have one ends respectively connected to the external output terminals 32 and the other ends respectively disposed at positions extending along a second side 72 of the chip mounting area 61. The second side 72 is a side opposite to the first side 71. The output wirings 42 are provided in plural form and formed integrally with the external output terminals 32 as needed. The internal input wirings 43 have one ends respectively connected to the external input terminals 31 and the other ends respectively led out to positions lying inside the chip mounting area 61. The internal input wirings 43 are generally signal wires or lines arranged continuously in plural form. They are, for example, data lines corresponding to 10 bits or correspond to reference voltage for gradation voltages.

The semiconductor chip 20 is rectangular and provided, on its surface, with the plural input electrodes 51 provided along the first side 71, the output electrodes 52 provided along the second side 72, and the internal input electrodes 53 disposed inside the input electrodes 51 and the output electrodes 52. The input electrodes 51 are respectively connected to the input wirings 41 through unillustrated bumps. The output electrodes 52 are respectively connected to the output wirings 42 through unillustrated bumps. The internal input electrodes 53 are respectively connected to the internal input wirings 43 through unillustrated bumps. The output electrodes 52 might be also formed along all of the four sides depending upon where they are formed along the sides other than the second side 72. The output electrodes 52 are suitably disposed depending on the number thereof. The internal input electrodes 53 are disposed in the neighborhood of predetermined functional blocks. If a signal inputted to each of the internal input electrodes 53 is assumed to be a reference voltage for a gradation voltage generating circuit, each internal input electrode is then located in the neighborhood of a ladder resistor 80 provided in the gradation voltage generating circuit in the present embodiment. If an image data signal or the like is taken for each of the internal input electrodes 53, each internal input electrode 53 is then located in the neighborhood of a unit for processing the corresponding signal.

Thus, according to the present embodiment, the internal input electrodes 53 are disposed in the neighborhood of the functional blocks (ladder resistors 80 in particular) respectively connected thereto, and the signals are transmitted from the external input terminals 31 to the neighborhoods of the functional blocks through the internal input wirings 43. It is therefore possible to cut down or shorten a physical distance between each input electrode and its corresponding functional block and reduce wirings lying inside the semiconductor element or chip. As a result, the impedance of each wiring lying inside the semiconductor element can be lowered and each wiring area lying inside the semiconductor element can be reduced or cut down. In brief, it is possible to supply power to the ladder resistor 80 in a more variation-free form and reduce the area of the semiconductor element or chip 10.

Second Preferred Embodiment

Figure 2:
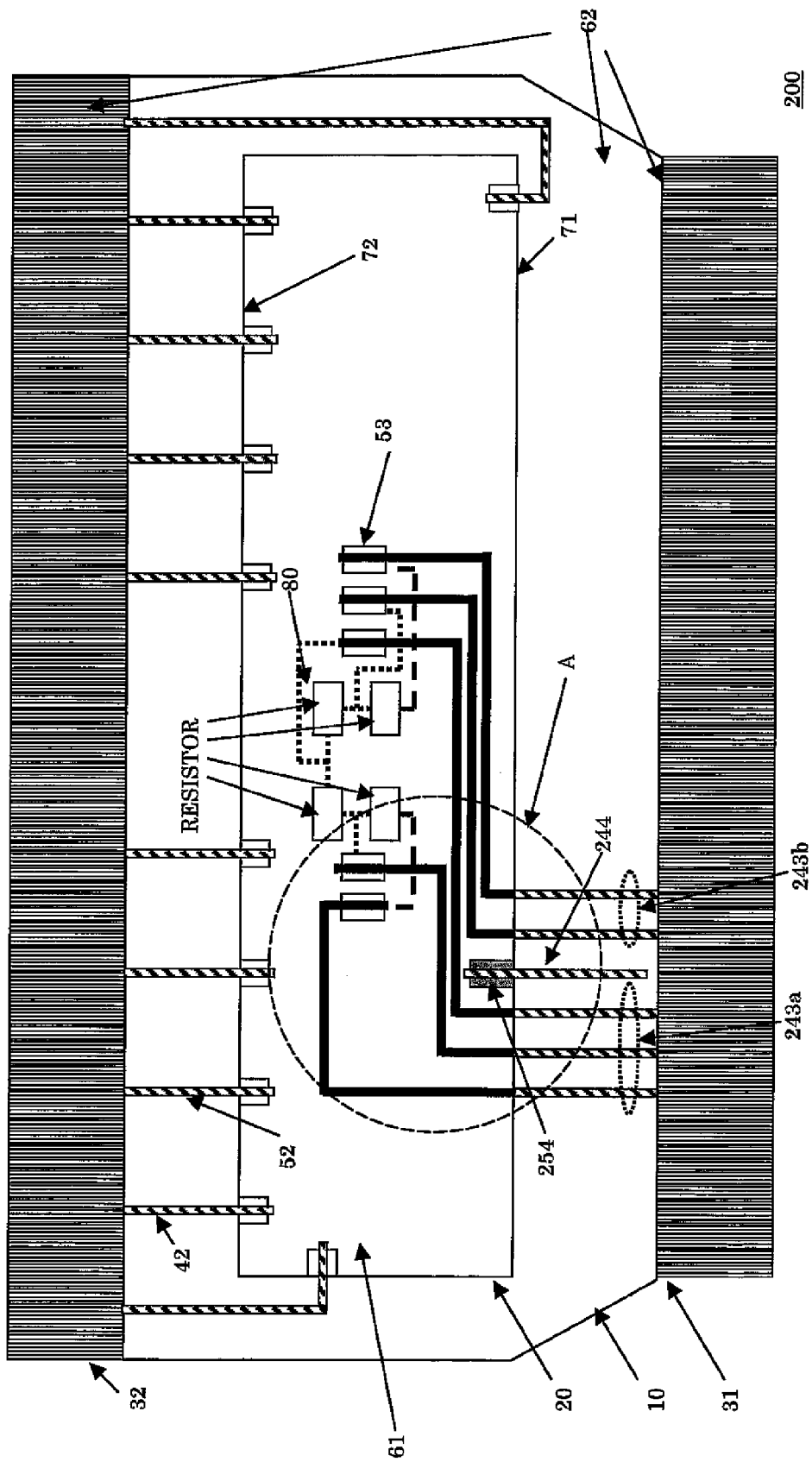
FIG. 2 is a conceptual diagram illustrating a COF package according to a second embodiment of the present invention.
Figure 3:
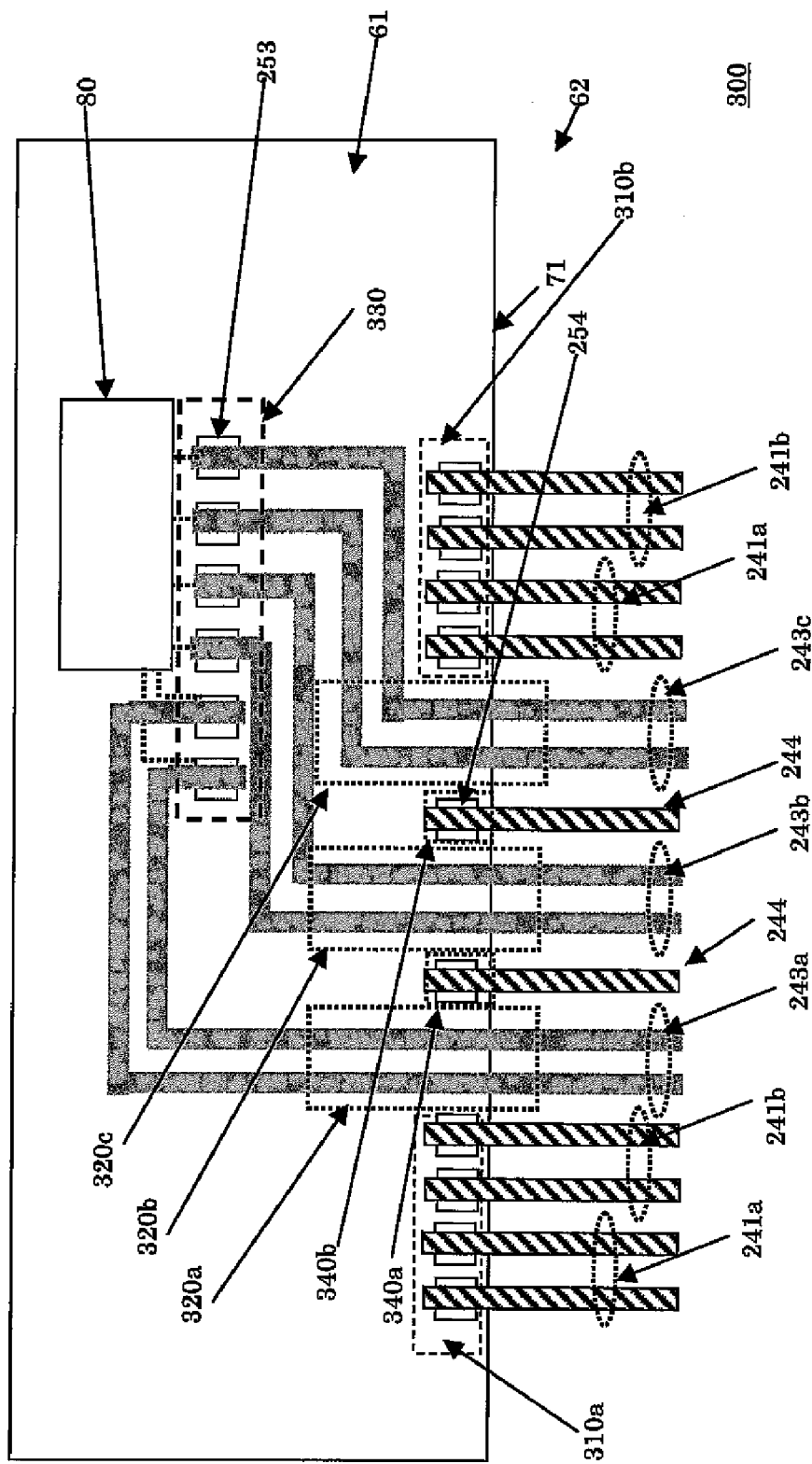
FIG. 3 is a detailed diagram of a portion A shown in FIG. 2.

FIG. 2 shows a COF package according to a second embodiment of the present invention. FIG. 3 is a detailed diagram of a portion A shown in FIG. 2. The second embodiment will be explained below using FIGS. 2 and 3. Portions or elements different from those employed in the first embodiment will be explained in the following description.

As shown in FIG. 2, the invention of the second embodiment features that a dummy wiring 244 corresponding to a fourth wiring pattern is disposed between internal input wirings 243a and internal input wirings 243b in a tape substrate 10, and a dummy electrode 254 is disposed in a semiconductor chip 20.

The details of the second embodiment will be explained using FIG. 3. Part of the COF package is shown in FIG. 3. Areas are respectively formed or defined within a chip mounting area 61 provided on the tape substrate 10. A plurality of input electrode connecting areas 310 are defined along a first side 71. A plurality of wiring passage areas 320 are defined between an input electrode connecting area 310a and an input electrode connecting area 310b. The plural wiring passage areas 320 are respectively provided along the first side 71. An internal input electrode connecting area 330 is defined inside the chip mounting area 61 with respect to the input electrode connecting areas 310. Each dummy electrode connecting area 340 is defined between the adjacent wiring passage areas 320. For example, a dummy electrode connecting area 340a is defined between a wiring passage area 320a and a wiring passage area 320b. The dummy electrode connecting areas 340 also extend along the first side 71. Incidentally, although not shown in FIG. 3, output electrode connecting areas are obviously defined around the chip mounting area 61 in which output electrodes can be disposed as shown in FIG. 2.

Input wirings 241 are disposed in the respective input electrode connecting areas 310. Further, the input wirings 241 and their corresponding input electrodes 51 are connected to one another via bumps. The input wirings 241a are, for example, wirings for supplying power, and the input wirings 241b are connected to ground. Internal input wirings 243 are disposed in the wiring passage areas 320. The dummy wirings 244 are disposed in their corresponding dummy electrode connecting areas 340 and connected to their corresponding dummy electrodes 254 via bumps. Incidentally, it is preferable that the dummy electrodes 254 are connected to a power supply and ground via internal wirings. The dummy wirings 244 extend in the direction of external input terminals 31 in parallel with the adjoining internal input wirings 243. However, the dummy wirings 244 are not connected to the external input terminals 31. It is desirable to make the distance between each of the dummy wiring 244 and its adjoining internal input wiring 243 equal to the interval between the other input wirings 241 and the distance between each of the input wirings 241 and its corresponding internal input wiring 243.

The strength of connection between the tape substrate 10 and the semiconductor chip 20 generally depends upon the connections between the input wirings 41 or the output wirings 42 disposed on the tape substrate 10 and the input electrodes 51 or the output electrodes 52 disposed on the semiconductor chip 20. Since the COF package is often mounted with being folded, it is feared that large stress is applied thereto. Thus, it is required that the reliability (peeling strength) of connection between the tape substrate 10 and the semiconductor chip 20 is held uniformly over the entire COF package. In the COF package shown in FIG. 1, at least five internal connecting wirings 43 are disposed continuously. It is also considered that ten or more are made continuous considering the reference voltage for the gradation voltage referred to above.

In the present embodiment, each dummy wiring 244 is provided in the area interposed between the wiring passage areas 320 of the tape substrate 10. The dummy wiring 244 is connected to its corresponding dummy electrode 254 provided in the semiconductor chip 20 to make it possible to ensure the reliability of connection between the tape substrate 10 and the semiconductor chip 20. It is desirable that the dummy wirings 243 are provided at intervals of within three internal input wirings 244 to determine high connection reliability in particular. In other words, when the four or more internal input wirings 243 are disposed continuously, it is desirable to reinforce the strength of connection by the dummy wiring 244, bump and dummy electrode 254 to be provided at least therebetween for one thing.

It is desirable to space 150 μm or less between each of the input electrodes 51 and each of the dummy electrodes 254 or between the adjacent dummy electrodes 254. Considering that the width of the input electrode 51 and the width of the dummy electrode 254 are less than 30 μm, the internal input wirings 243 can be disposed continuously up to three. Spacing 150 μm or less between the input electrode 51 and the dummy electrode 254 or between the adjacent dummy electrodes 254 makes it possible to control flowing out of a sealing resin for sealing the table substrate 10 and the semiconductor chip 20 and prevent a shape abnormality of the sealing resin. The distance between the input wiring 241 and the dummy wiring 244 is also similar to that between the input electrode 51 and the dummy electrode 254. Here, the definition of the distance means the distance between the centers of objects to be targeted.

Incidentally, it is desirable to set all of the input wirings 241, internal input wirings 243 and dummy wirings 244 to the same wiring width. It is possible to enhance controllability of a resin at its pouring and suppress variations at the formation of wirings on the tape substrate.

While the preferred forms of the present invention have been described, it is to be understood that modifications will be apparent to those skilled in the art without departing from the spirit of the invention. The scope of the invention is to be determined solely by the following claims.

What is claimed is:

1. A COF package comprising:
   a tape substrate; and
   a rectangular semiconductor chip mounted over the tape substrate with a chip surface thereof being opposite to the tape substrate,
   said tape substrate including
      a rectangular chip mounting area and a chip non-mounting area,
      a plurality of external input terminals extending in a first direction and a plurality of external output terminals provided in the chip non-mounting area,
      a plurality of input wirings provided from the chip non-mounting area to the chip mounting area and connected to the external input terminals respectively,
      a plurality of output wirings provided from the chip non-mounting area to the chip mounting area and connected to the external output terminals respectively,
      a plurality of internal input wirings which are provided from the chip non-mounting area to the chip mounting area and provided between the input wirings and which are connected to the external input terminals, respectively, and
      a dummy wiring provided from the chip non-mounting area to the chip mounting area and provided between the internal input wirings, the dummy wiring extending in a direction parallel to the first direction, and said semiconductor chip including
      a plurality of input electrodes provided along one side of the semiconductor chip extending over the chip surface and connected to the input wirings respectively,
      a plurality of output electrodes provided along a periphery extending over the chip surface and connected to the output wirings respectively, internal input electrodes provided over the chip surface and between the input and output electrodes, and connected to the internal input wirings respectively, and a dummy electrode provided spaced from each of the input electrodes along the one side lying over the chip surface and connected to the dummy wiring.

2. The COF package according to claim 1, wherein the dummy electrode is connected to ground within the semiconductor chip.

3. The COF package according to either of claim 1 or 2, wherein the internal input wirings are at least four or more.

4. A COF package comprising:
a tape substrate formed with an external input terminal extending in a first direction and an external output terminal, and a plurality of wiring patterns respectively connected to the external input terminal and the external output terminal; and a rectangular semiconductor chip mounted over the tape substrate, said semiconductor chip including
a plurality of first electrodes formed along a first side lying over a surface of the semiconductor chip,
a plurality of second electrodes formed along a side opposite to the first side,
a plurality of third electrodes formed in a neighborhood of functional blocks, and at least one fourth electrode formed along the first side and spaced a predetermined distance between the first electrodes, and said tape substrate including
a plurality of first wiring patterns which connect the external input terminal and the first electrodes respectively,
a plurality of second wiring patterns which connect the external output terminal and the second electrodes respectively,
a plurality of third wiring patterns which pass between connecting points of the first electrodes and the first wiring patterns respectively and connect the external input terminal and the third electrodes respectively, and
at least one fourth wiring pattern provided between the third wiring patterns and connected to the at least one fourth electrode,
wherein the at least one fourth wiring pattern is unconnected to the external input terminal and the external output terminal, and extends in a direction parallel to the first direction.

5. The COF package according to claim 4, wherein the third wiring patterns are respectively provided on both sides of the at least one fourth wiring pattern in increments of at least two or more.

6. A tape substrate suitable for use in a COF package wherein a rectangular semiconductor chip is mounted over the tape substrate with a chip surface thereof being opposite thereto, signals inputted from external input terminals provided over the tape substrate are inputted to the semiconductor chip through input wirings, and an output of the semiconductor chip is outputted from each of external output terminals through each of output wirings, said tape substrate having a rectangular chip mounting area which includes there inside
input electrode connecting areas provided along one side of the chip mounting area,
output electrode connecting areas provided along a second side of the chip mounting area opposite the one side,
a plurality of wiring passage areas provided between the input electrode connecting areas and along the one side,
dummy electrode connecting areas provided between the wiring passage areas and provided along the one side, and
an internal electrode connecting area provided between the input electrode connecting areas and the output electrode connecting areas,
wherein the input wirings include first wiring patterns provided from the external input terminals to the input electrode connecting areas, and second wiring patterns provided from the external input terminals to the internal electrode connecting area and provided through the wiring passage areas, the external input terminals extending in a first direction, and
wherein the input wirings include third wiring patterns provided between the second wiring patterns and in the dummy electrode connecting areas, the third wiring patterns extending in a direction parallel to the first direction.

7. A COF package comprising:
a tape substrate; and
a semiconductor chip,
wherein electrodes of the semiconductor chip are electrically connected to their corresponding wirings via bumps at a peripheral edge of a chip mounting area of the tape substrate and an inside portion thereof,
wherein the tape substrate includes at least two or more input wirings, four or more internal input wirings and dummy wirings,
wherein the dummy wirings are interposed between the internal input wirings, and said at least four internal input wirings are disposed as interposed between the input wirings, and
wherein the internal input wirings are connected to the semiconductor chip at the inside portion of the chip mounting area, and the input wirings and the dummy wirings connect to the semiconductor chip at the peripheral edge of the chip mounting area.

8. The COF package according to claim 7, wherein the dummy wirings are disposed along the internal input wirings.

9. The COF package according to either of claim 7 or 8, wherein a distance between each of the dummy wirings and each of the internal input wirings is equal to that between the input wirings.

10. The COF package according to any of claims 7 and 8, wherein a distance between the dummy wirings and an input wiring closest thereto is less than or equal to 150 μm.

11. The COF package according to any of claims 7 and 8, wherein the input wirings adjacent to the internal input wirings are wirings to each of which a high power supply or a ground potential is applied.

12. The COF package according to any of claims 7 and 8, wherein the dummy wirings are equal to the input wirings in wiring width.

* * * * *